(12) United States Patent
Chen et al.

(10) Patent No.: US 12,300,740 B2
(45) Date of Patent: May 13, 2025

(54) METAL LAYER PROTECTION DURING WET ETCHING

(71) Applicant: Taiwan Semiconductor Manufacturing Company, Ltd., Hsinchu (TW)

(72) Inventors: Kuo-Ju Chen, Taichung (TW); Su-Hao Liu, Chiayi (TW); Huicheng Chang, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/624,725

(22) Filed: Apr. 2, 2024

(65) Prior Publication Data

US 2024/0250147 A1    Jul. 25, 2024

Related U.S. Application Data

(62) Division of application No. 17/809,025, filed on Jun. 27, 2022, now Pat. No. 11,984,491.

(51) Int. Cl.
*H01L 29/66* (2006.01)

(52) U.S. Cl.
CPC .... *H01L 29/6634* (2013.01); *H01L 29/66045* (2013.01)

(58) Field of Classification Search
CPC ........... H01L 27/0924; H01L 21/31051; H01L 27/0207; H01L 29/0649; H01L 21/32115; H01L 21/823828; H01L 29/66681; H01L 21/823821; H01L 29/0657; H01L 29/4966; H01L 29/0882; H01L 29/66545; H01L 29/4983; H01L 29/785; H01L 29/1037; H01L 29/0653; H01L 29/66659; H01L 29/7835; H01L 29/66689; H01L 29/7816;
(Continued)

(56) References Cited

U.S. PATENT DOCUMENTS 9,230,864 B1    1/2016  Lu et al.
10,879,370 B2   12/2020 Lim et al.
(Continued)

FOREIGN PATENT DOCUMENTS

TW       I668744 B    8/2019

*Primary Examiner* — Moin M Rahman
(74) *Attorney, Agent, or Firm* — Lorenz & Kopf, LLP

(57) ABSTRACT

Disclosed is a method of fabricating a contact in a semiconductor device. The method includes: receiving a semiconductor structure having an opening into which the contact is to be formed; forming a metal layer in the opening; forming a bottom anti-reflective coating (BARC) layer in the opening; performing implanting operations with a dopant on the BARC layer and the metal layer, the performing implanting operations including controlling an implant energy level and controlling an implant dosage level to form a crust layer with a desired minimum depth on top of the BARC layer; removing unwanted metal layer sections using wet etching operations, wherein the crust layer and BARC layer protect remaining metal layer sections under the BARC layer from metal loss during the wet etching operations; removing the crust layer and the BARC layer; and forming the contact in the opening over the remaining metal layer sections.

20 Claims, 10 Drawing Sheets

(58) Field of Classification Search
CPC ......... H01L 21/2808; H01L 21/8238–823892; H01L 27/092–0928; H01L 29/04–045; H01L 29/16–1608; H01L 29/18–185; H01L 29/22–2206; H01L 29/36–365; H01L 21/823493; H01L 21/823885; H01L 21/823412; H01L 29/66522; H01L 29/20–2006; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/7883; H01L 21/76831; H01L 21/76805; H01L 29/78; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22

See application file for complete search history.

(56) References Cited

U.S. PATENT DOCUMENTS

| | | |
|---|---|---|
| 2010/0087038 A1 | 4/2010 | Chung et al. |
| 2010/0087055 A1 | 4/2010 | Lai et al. |
| 2010/0124818 A1 | 5/2010 | Lee et al. |
| 2013/0113027 A1* | 5/2013 | Chiang ................. H01L 29/518 438/300 |

* cited by examiner

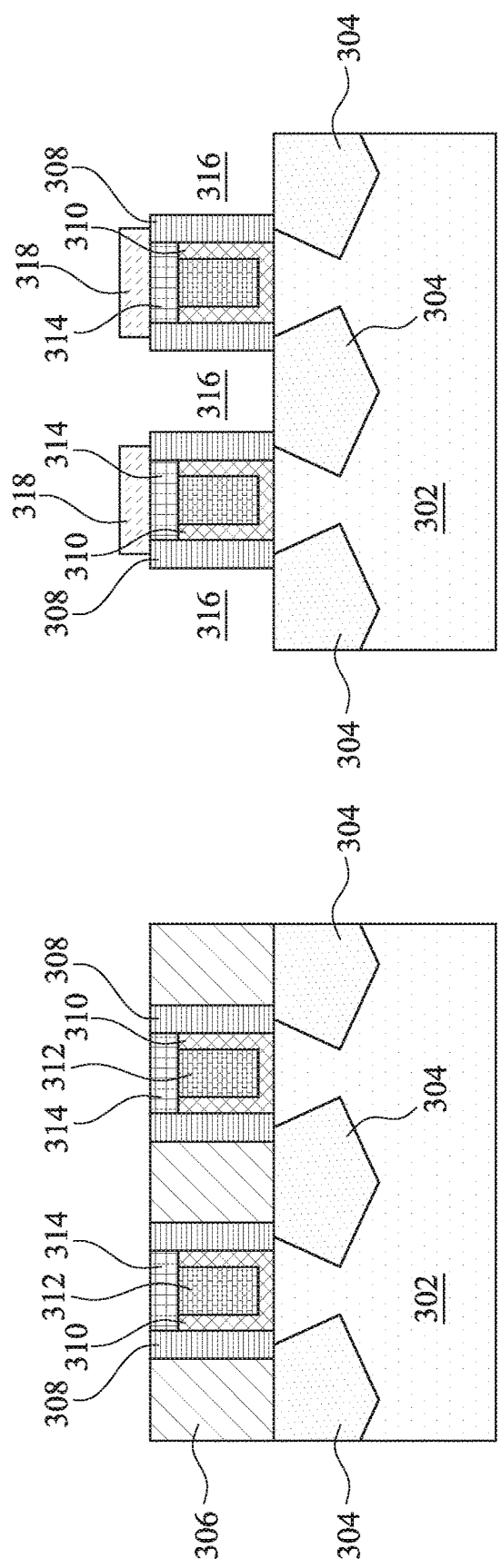
Fig. 3A
Fig. 3B
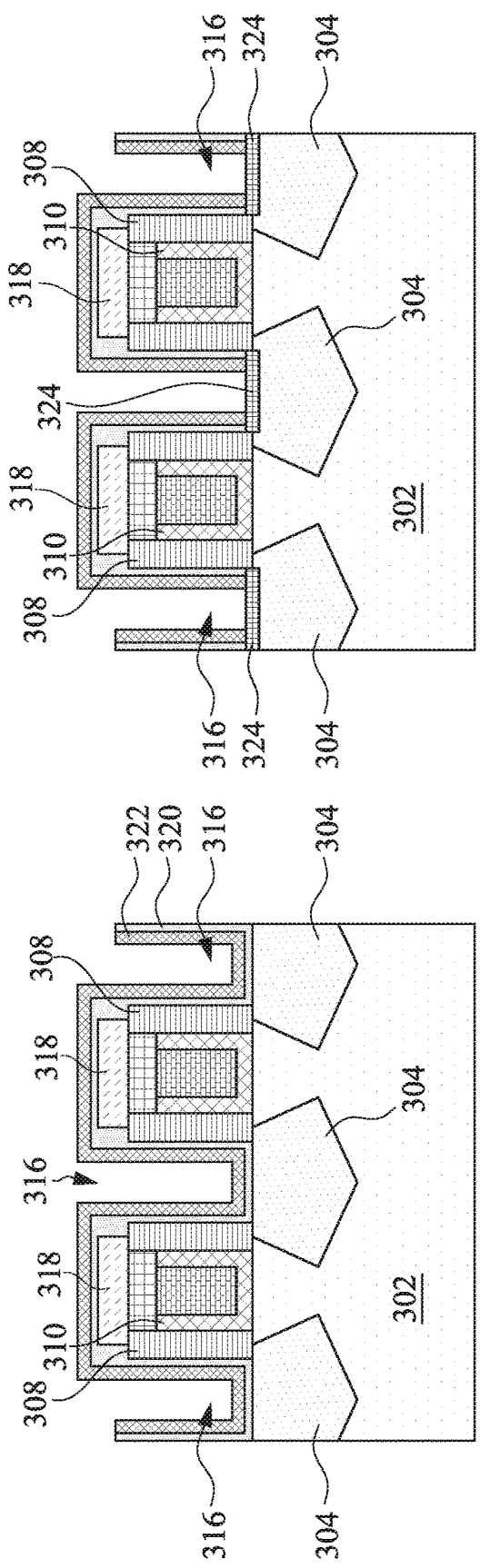
Fig. 3C
Fig. 3D

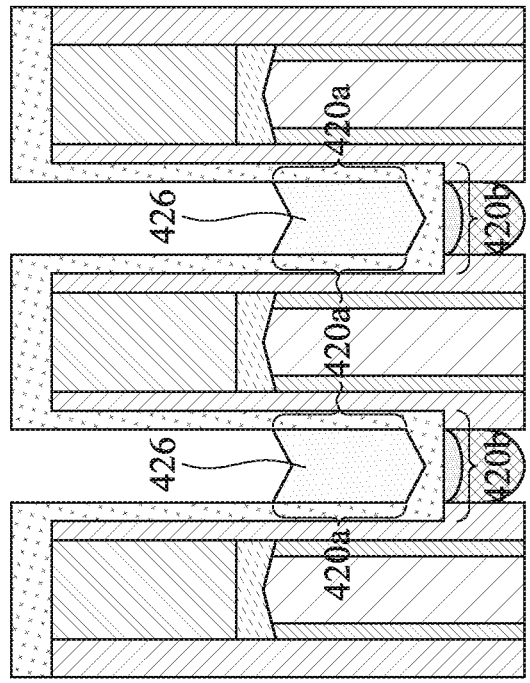
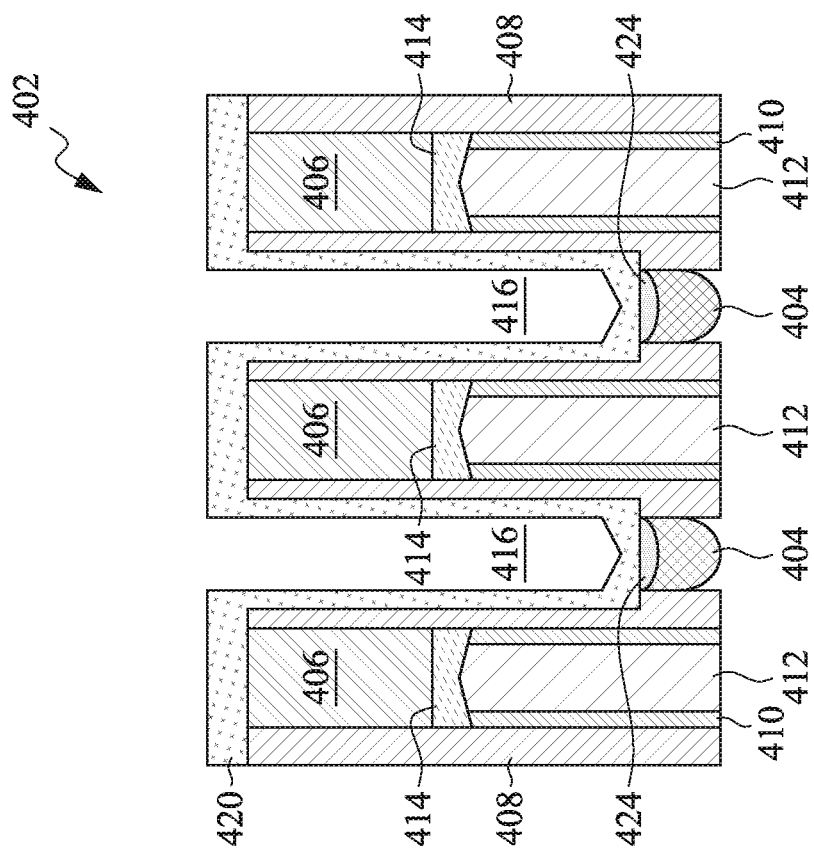
Fig. 4B
Fig. 4A

METAL LAYER PROTECTION DURING WET ETCHING

CROSS-REFERENCE TO RELATED APPLICATION

This application claims the benefit as a divisional of U.S. patent application Ser. No. 17/809,025, having the same title as this application, and filed on Jun. 27, 2022. This application incorporates the prior application into the present application by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are diagrams depicting cross-sectional views of a portion of an example semiconductor structure at various stages of fabrication, in accordance with some embodiments.

FIGS. 4A-4F are diagrams depicting enlarged views of a portion of an example semiconductor structure at various stages of fabrication, in accordance with some embodiments.

DETAILED DESCRIPTION

Figure 1:
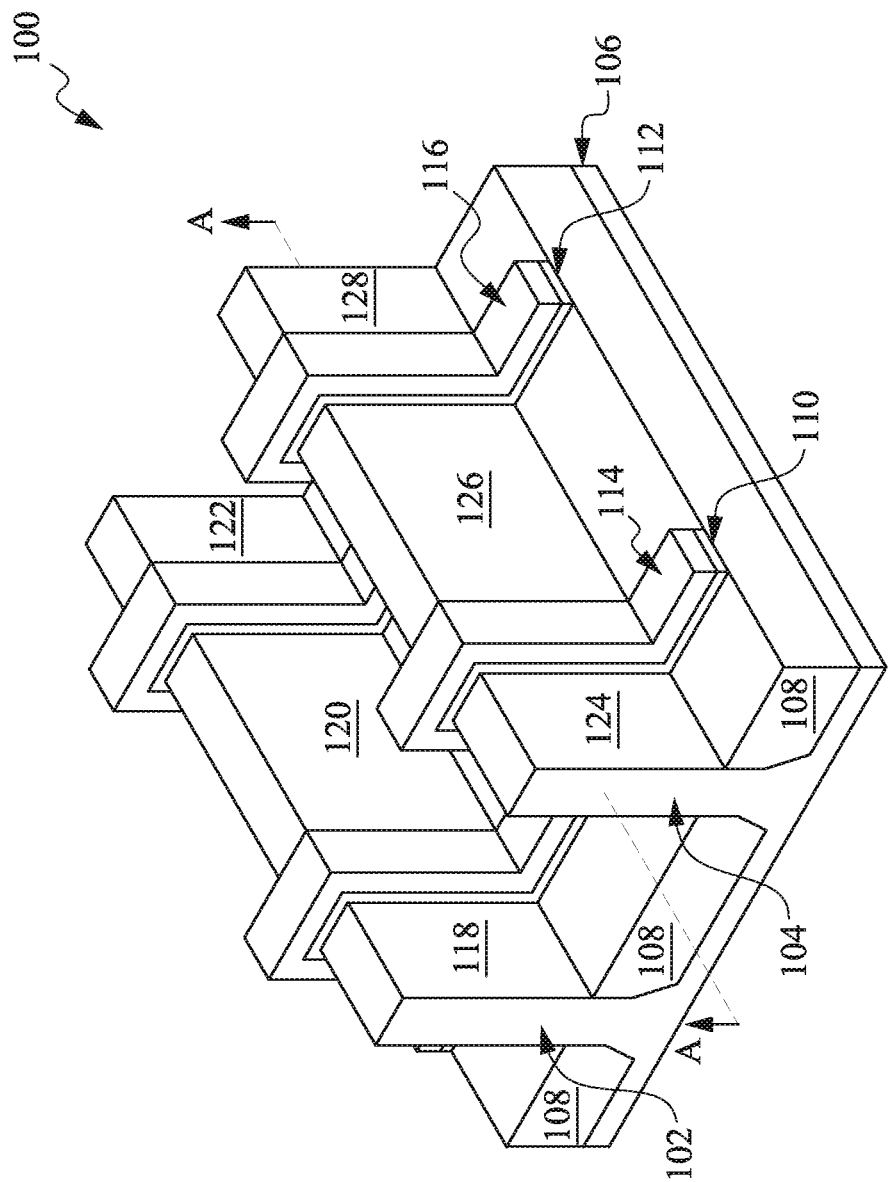
FIG. 1 is a diagram illustrating a section of an example semiconductor structure in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device. Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The subject matter described herein discloses apparatus, systems, techniques, and articles for forming a glue layer for use with a contact wherein the glue layer experiences zero or near zero unwanted metal loss during metal pull back by wet etching operations. The described apparatus, systems, techniques, and articles can prevent or reduce unwanted metal loss during wet etching operations.

Referring now to the figures, FIG. 1 illustrates a section of an example semiconductor structure 100 in a three-dimensional view. Other aspects not illustrated in or described with respect to FIG. 1 may become apparent from the following figures and description. The semiconductor structure 100 in FIG. 1 may be electrically connected or coupled in a manner to operate as, for example, one FinFET or more, such as four FinFETs.

The example semiconductor structure 100 includes fins 102 and 104 on a substrate 106. The substrate 106 includes isolation regions 108, and the fins 102 and 104 each protrude above and from between neighboring isolation regions 108. Gate dielectrics 110 and 112 are along sidewalls and over top surfaces of the fins 102 and 104, and gate electrodes 114 and 116 are over the gate dielectrics 110 and 112, respectively. Source/drain regions 118, 120, 122 are disposed in respective regions of the fin 102, and source/drain regions 124, 126, 128 are disposed in respective regions of the fin 104. Source/drain region(s) may refer to a source or a drain, individually or collectively dependent upon the context. Source/drain regions 118 and 120 are disposed in opposing regions of the fin 102 with respect to the gate dielectric 110 and gate electrode 114. Source/drain regions 120 and 122 are disposed in opposing regions of the fin 102 with respect to the gate dielectric 112 and gate electrode 116. Source/drain regions 124 and 126 are disposed in opposing regions of the fin 104 with respect to the gate dielectric 110 and gate electrode 114. Source/drain regions 126 and 128 are disposed in opposing regions of the fin 104 with respect to the gate dielectric 112 and gate electrode 116.

In some examples, four transistors may be implemented by: (1) source/drain regions 118 and 120, gate dielectric 110, and gate electrode 114; (2) source/drain regions 120 and 122, gate dielectric 112, and gate electrode 116; (3) source/drain regions 124 and 126, gate dielectric 110, and gate electrode 114; and (4) source/drain regions 126 and 128, gate dielectric 112, and gate electrode 116. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions (118, 120, 122, 124, 126, 128) are electrically connected, such as through coalescing the regions by epitaxial growth (e.g., source/drain regions 52a and 52d being coalesced, source/drain regions 118 and 124 being coalesced, etc.), two functional transistors may be implemented. Other configurations in other examples may implement other numbers of functional transistors.

FIG. 1 further illustrates a reference cross-section that is used in later figures. Cross-section A-A is in a plane along, e.g., channels in the fin 104 between opposing source/drain regions (124, 126, 128). Subsequent figures refer to these reference cross-sections for clarity.

Figure 2:
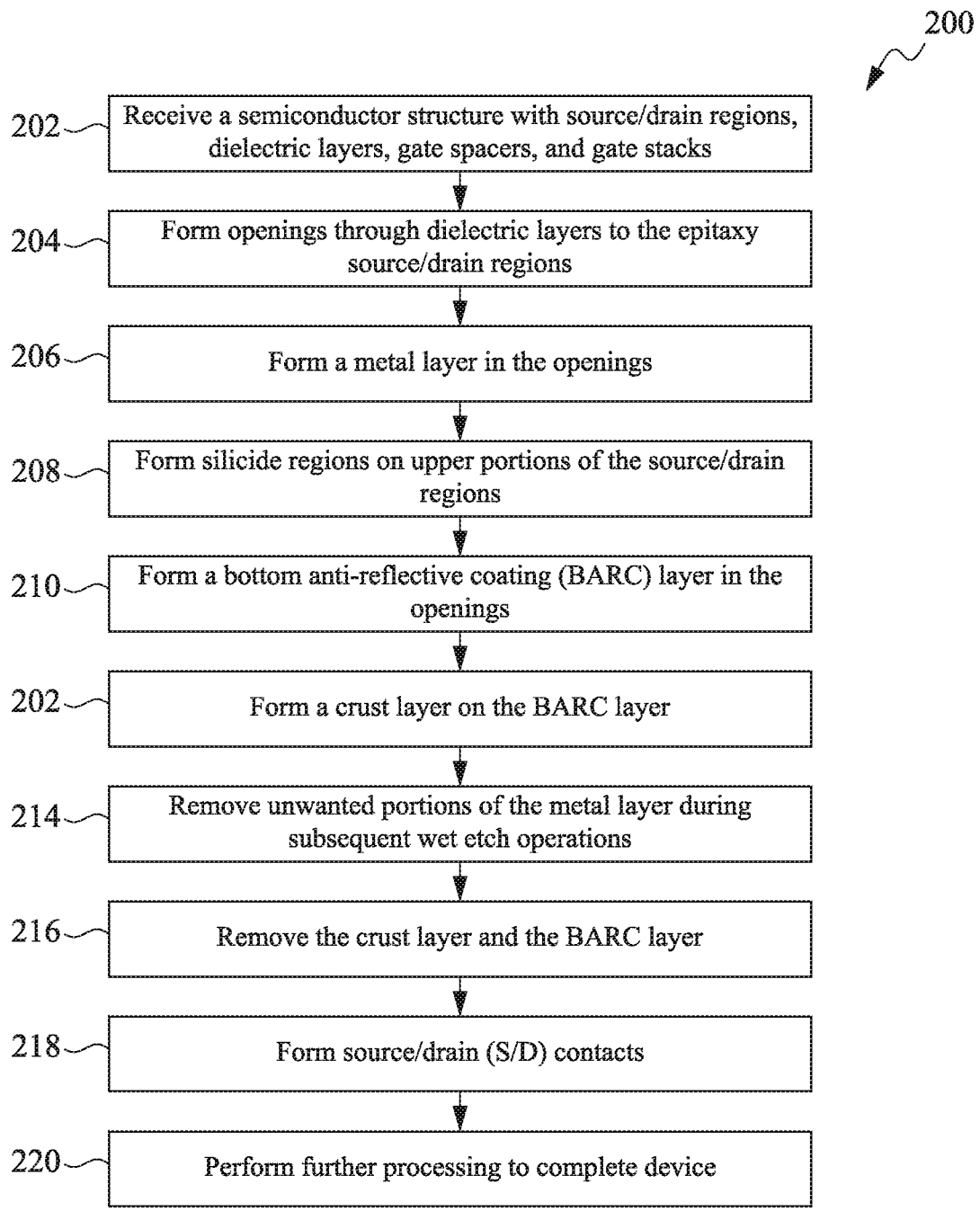
FIG. 2 is a flow chart depicting an example method for forming a semiconductor structure, such as a FinFET, in accordance with some embodiments.

FIG. 2 is a flow chart depicting an example method 200 for forming a semiconductor structure, such as a FinFET, according to various aspects of the present disclosure. FIG. 2 is described in conjunction with FIGS. 3A-3D and 4A-4F, which illustrate a semiconductor device or structure at various stages of fabrication in accordance with some embodiments. The method 200 is merely an example, and is not intended to limit the present disclosure beyond what is explicitly recited in the claims. Additional steps may be provided before, during, and after method 200, and some of these steps describe can be moved, replaced, or eliminated for additional embodiments of method 200. Additional features may be added in the semiconductor device depicted in the figures, and some of the features described below can be replaced, modified, or eliminated in other embodiments.

As with the other method embodiments and exemplary devices discussed herein, it is understood that parts of the semiconductor devices may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, dials, fuses, and or other logic devices, etc., but is simplified for better understanding of concepts of the present disclosure. In some embodiments, exemplary devices include a plurality of semiconductor devices (e.g., transistors), including PFETs, NFETs, etc., which may be interconnected. Moreover, it is noted that the process steps of method 200, include any descriptions given with reference to the figures, as with the remainder of the method and exemplary figures provided in this disclosure, are merely exemplary and are not intended to be limiting beyond what is specifically recited in the claims that follow.

FIGS. 3A-3D are diagrams depicting cross-sectional views of a portion of an example semiconductor structure at various stages of fabrication in accordance with some embodiments. In some figures, some reference numbers of components or features illustrated therein may be omitted to avoid obscuring other components or features; this is for ease of depicting the figures.

At operation 202, the example method 200 includes receiving a semiconductor structure that includes source/drain regions, dielectric layers, gate spacers, and gate stacks. FIG. 3A provides a cross-sectional view of a portion of an example semiconductor structure. Depicted is an example fin 302. The example fin 302 includes epitaxy source/drain regions 304, dielectric layers 306, gate spacers 308, gate stacks comprising gate dielectrics 310 and gate electrodes 312, and masks 314.

The epitaxy source/drain regions 304 may include or be silicon germanium ($Si_xGe_{1-x}$, where x can be between approximately 0 and 100), silicon carbide, silicon phosphorus, pure or substantially pure germanium, a III-V compound semiconductor, an II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like.

The dielectric layers 306 may comprise or be silicon dioxide, a low-K dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, Spin-On-Glass, Spin-On-Polymers, silicon carbon material, a compound thereof, a composite thereof, the like, or a combination thereof.

The gate spacers 308 may include or be silicon nitride, silicon oxynitride, silicon carbon nitride, the like, multi-layers thereof, or a combination thereof.

The gate dielectrics 310 can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof.

The gate electrodes 312 may be or comprise a metal-containing material such as TiN, TaN, TaC, Co, Ru, Al, multi-layers thereof, or a combination thereof.

The masks 314 may include or be silicon nitride, silicon oxynitride, silicon carbide, silicon carbon nitride, the like, or a combination thereof.

In some embodiments, a gate-replacement (gate-last) process is employed to fabricate the gate stacks. In some embodiments, gate stacks with a gate dielectric and gate electrode may be implemented in a gate-first process rather than a replacement gate process.

At operation 204, the example method 200 includes forming openings through dielectric layers to the epitaxy source/drain regions. FIG. 3B illustrates the formation of openings 316 through the one or more dielectric layers 306 to the epitaxy source/drain regions 304 to expose at least respective portions of the epitaxy source/drain regions 304. A mask 318 is formed on the one or more dielectric layers 306 and masks 314 for forming the openings 316. The mask 318 may include or be silicon nitride, silicon oxynitride, silicon carbon nitride, the like, or a combination thereof, deposited by CVD, PVD, ALD, or another deposition technique. The mask 318 may then be patterned, for example, using photolithography and one or more etch processes. Using the mask 318, the openings 316 can be formed through the one or more dielectric layers 306 using one or more etch processes, such as reactive ion etching (RIE), neutral beam etching (NBE), or another etch process At operation 206, the example method 200 includes forming a metal layer in the openings. FIG. 3C illustrates the formation of a metal layer 320 and a barrier layer 322 in the openings 316. The metal layer 320 is conformally deposited in the openings 316, and the barrier layer 322 is conformally deposited on the metal layer 320. Particularly, the metal layer 320 is deposited on upper surfaces of the epitaxy source/drain regions 304 exposed by the openings 316, and along other surfaces of the openings 316. The metal layer 320 may be or comprise, for example, titanium, cobalt, nickel, the like or a combination thereof, and may be deposited by atomic layer deposition (ALD), chemical vapor deposition (CVD), or another deposition technique. The metal layer 320 may be deposited to a thickness in a range from 2 nanometers (nm) to about 15 nm, for example. The barrier layer 322 may be or comprise titanium nitride, titanium oxide, tantalum nitride, tantalum oxide, the like, or a combination thereof, and may be deposited by ALD, CVD, or another deposition technique. The barrier layer 322 may be deposited to a thickness in a range from 2 nm to about 15 nm, for example.

At operation 208, the example method 200 includes forming silicide regions on upper portions of the source/drain regions. FIG. 3D illustrates the formation of silicide regions 324 on upper portions of the epitaxy source/drain regions 304. The silicide regions 324 may be formed by reacting upper portions of the epitaxy source/drain regions 304 with the metal layer 320 and/or barrier layer 322. An anneal is performed to facilitate the reaction of the epitaxy source/drain regions 304 with the metal layer 320 and/or barrier layer 322. The anneal may be at a temperature in a range from about 500° C. to about 600° C. for a duration of greater than or equal to about 10 seconds. The silicide regions 324 may have a thickness in a range from 2 nm to about 20 nm, for example.

FIGS. 4A-4F are diagrams depicting enlarged views of a portion of an example semiconductor structure at various stages of fabrication in accordance with some embodiments. In some figures, some reference numbers of components or features illustrated therein may be omitted to avoid obscuring other components or features; this is for ease of depicting the figures.

FIG. 4A depicts portions of an example fin and illustrates the formation of silicide regions 424 on upper portions of the epitaxy source/drain regions 404 of the example fin. The example fin 402 includes epitaxy source/drain regions 404 with silicide regions 424 on upper portions of the epitaxy source/drain regions 404, dielectric layers 406, gate spacers 408, gate stacks comprising gate dielectrics 410 and gate electrodes 412, and masks 414. The example fin 402 further includes openings 416 and a metal layer 420 in the openings 416. The metal layer 420 is conformally deposited in the openings 416 on upper surfaces of the epitaxy source/drain regions 404 exposed by the openings 416, and along other surfaces of the openings 416. The metal layer 420 may be or comprise, for example, titanium, cobalt, nickel, the like or a combination thereof, and may be deposited by atomic layer deposition (ALD), chemical vapor deposition (CVD), or another deposition technique. The metal layer 420 may be deposited to a thickness in a range from 2 nm to about 15 nm, for example.

At operation 210, the example method 200 includes forming a bottom anti-reflective coating (BARC) layer in the openings. FIG. 4B illustrates the formation of a BARC layer 426 in the openings 416. The BARC layer 426 is deposited in the openings 416 at a depth of about 100 nm, for example. The BARC layer 426 may be deposited by ALD, CVD, or another deposition technique.

The BARC layer 426 is deposited in the openings 416 to shield protected portions (420a, 420b) of metal layer 420 during subsequent wet etch operations. The BARC layer 426 is subsequently specially treated prior to the wet etch operations designed to remove portions of the metal layer 420 to improve its ability to shield the protected portions (420a, 420b) of metal layer 420 during the subsequent wet etch operations.

Figures 4C, 4D:
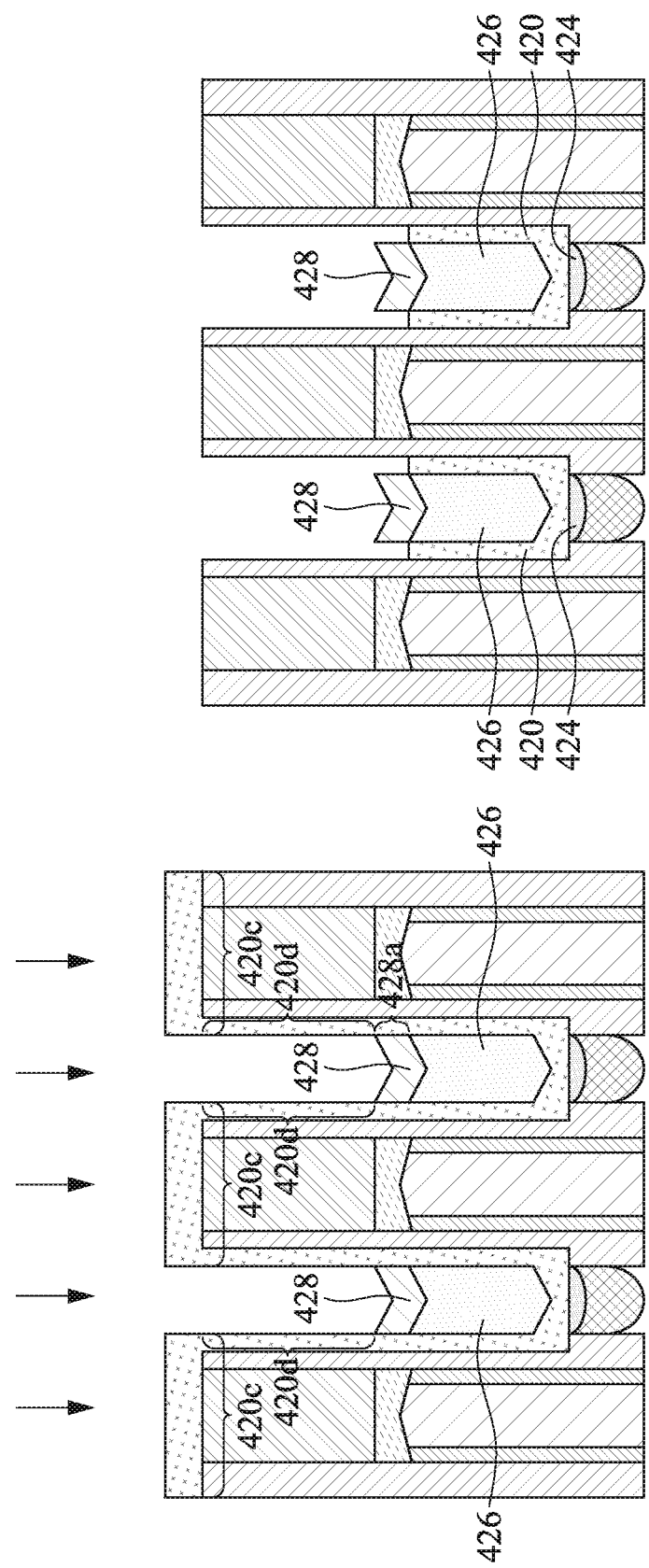

At operation 212, the example method 200 includes forming a specially treated layer or crust layer on upper portions of the BARC layer. FIG. 4C illustrates the formation of a specially treated layer or crust layer 428 on upper portions of the BARC layer 426. The crust layer 428 may be formed by reacting upper portions of the BARC layer 426 with an implant element. In accordance with some embodiments, silicon (Si) or germanium (Ge) is an implant element that is implanted. In accordance with some embodiments, an inert species such as neon (Ne), argon (Ar), xenon (Xe), and radon (Ra) is implanted. Crust formation may be performed by an implantation process with an implantation energy ranging from about 2 KeV to about 50 KeV, a flow rate dosage ranging from about 1×1014 atoms cm−2 to about 1×1014 atoms cm−2, a tilt angle ranging from 0 to about 60, and at a temperature ranging from about −100° C. to about 500° C.

The implantation process causes the crust layer 428 to be formed on the top of BARC layer 426 due to a carbonization process by the scission of C—O and C—H bonds, which leads to an increase of carbon content and a decrease in oxygen content in the crust layer 428 as compared to the rest of the BARC layer 426. As a result, the carbon ratio of the crust layer 428 may range from about 80 to about 90 percent (%), and the oxygen ratio of the crust layer 428 may range from about 10 to about 25%. The depth (428a) of the crust layer 428 may range from 1 to about 30 nm. The thickness of the upper portion of the BARC layer 428 that is consumed during the implantation process may range from 1 to about 50 nm.

In addition to causing an implant profile (crust layers 428) on the BARC layer 426, the implantation process also causes an implant layer formation on upper portions (420c) of the metal layer 420. The thickness of the upper portions (420c) of the metal layer 420 that is consumed during the implantation process may range from 1 to about 15 nm.

At operation 214, the example method 200 includes removing unwanted portions of the metal layer via wet etch operations (i.e., metal pull back by wet etch process). The remaining portions of the metal layer can function as a glue layer for subsequent source/drain (S/D) contact formation. FIG. 4D illustrates the removal of unwanted portions (420c, 420d) of metal layer 420 via metal pull back by wet etch process using chemical etchants. The crust layer 428 prevents chemical etchants from traversing through the BARC layer 426 during the wet etching operations thereby maintaining the integrity of the bottom of the portion of the metal layer 420 that are on the silicide regions 424. Unwanted metal loss is therefore reduced and/or eliminated during the wet etching operations.

The implant layer formation on upper portions (420c) of the metal layer 420 treats the upper portions (420c) of the metal layer 420 so that during the metal pull back by wet etch process the etching rate increases and less time is needed to remove the upper portions (420c) of the metal layer 420. This is helpful because a longer etching time can result in an increased likelihood of unwanted metal loss during the wet etching operations.

Figures 4E, 4F:
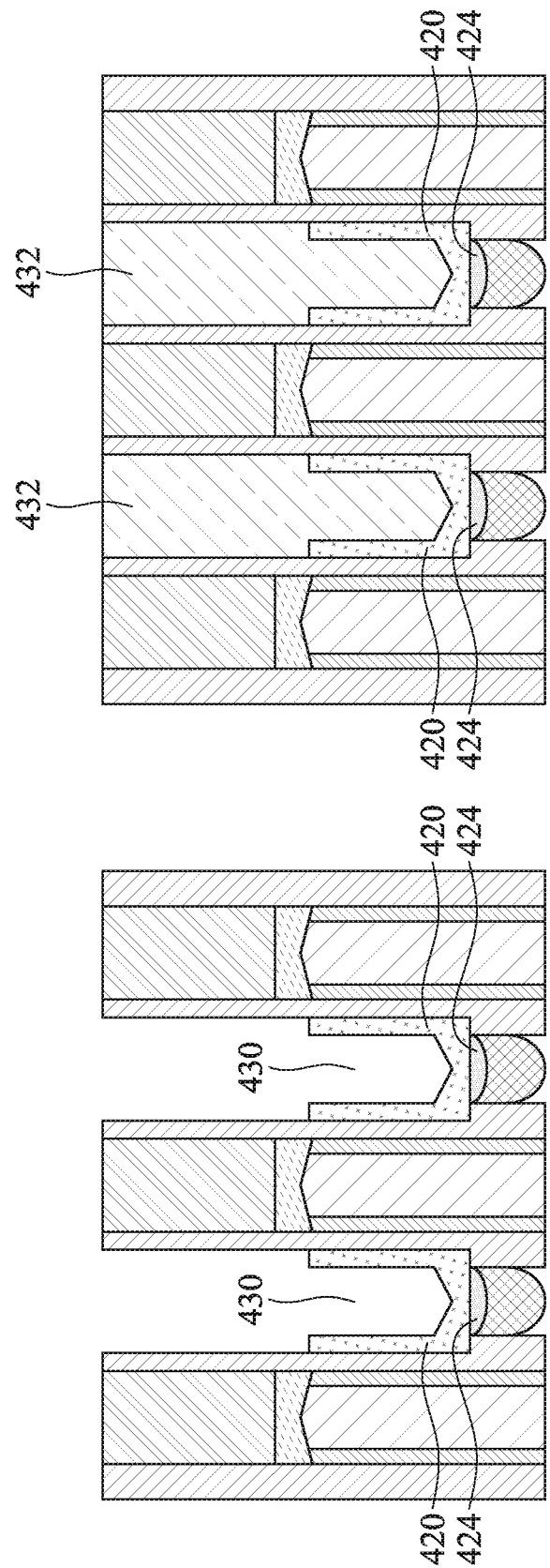

At operation 216, the example method 200 includes removing the crust layer and the BARC layer. The crust layer and the BARC layer may be removed via etching operations (e.g., a BARC etch back process) using, for example, wet clean operations with an organic solvent, a dry stripping process in a dry plasma chamber, and/or wet cleaning operations with a water based solution. FIG. 4E illustrates the removal of the crust layer 428 and the BARC layer 426 resulting in openings 430 between the protected portions (420a, 420b) of metal layer 420 and gate spacers 408. A glue layer for subsequent S/D contact formation remains without unwanted metal loss and that can achieve higher contact resistance.

At operation 218, the example method 200 includes forming source/drain (S/D) contacts. FIG. 4E illustrates the formation of source/drain (S/D) contacts 432. The contacts 432 are formed in the openings 430 between the protected portions (420a, 420b) of metal layer 420 and gate spacers 408. The contacts 432 may be or comprise tungsten, cobalt, copper, aluminum, gold, silver, alloys thereof, the like, or a combination thereof, and may be deposited by CVD, ALD, PVD, or another deposition technique. After the material of the contacts 432 is deposited, excess material may be removed by using a planarization process, such as a CMP, for example. Accordingly, conductive features including the contacts 432, metal layer 420, and/or silicide regions 424 may be formed to the epitaxy source/drain regions 404.

At operation 220, the example method 200 includes performing further processing to complete the semiconductor device. For example, the semiconductor structure can undergo additional fabrication processes such as the formation of various dielectric and conductive layers.

Figure 5B:
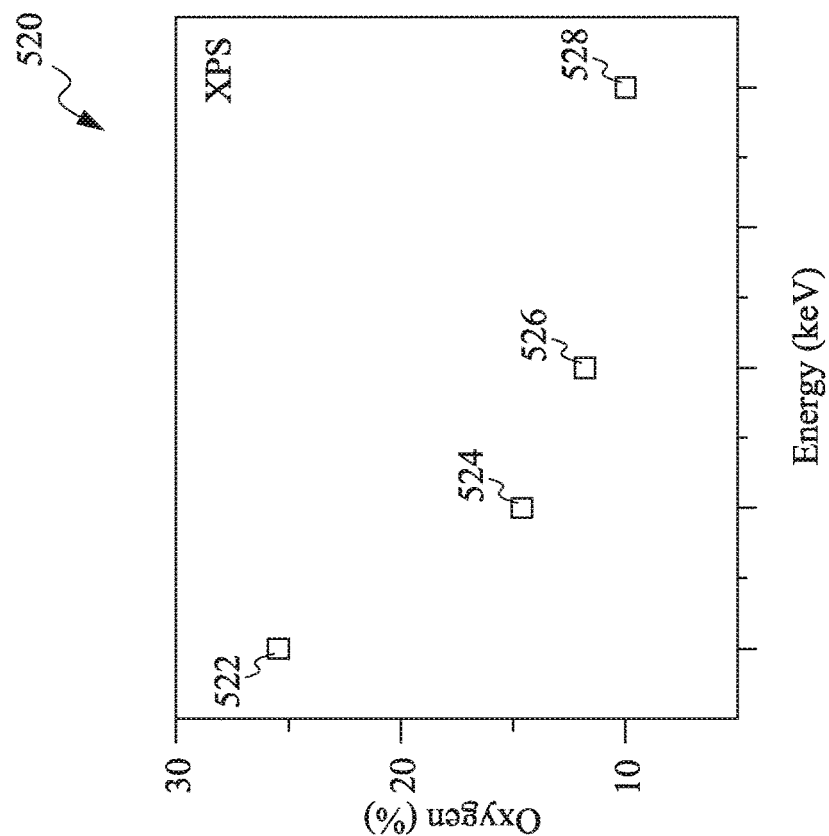
FIG. 5B is a graph illustrating the ratio of oxygen in an example crust layer as a function of implant energy level, in accordance with some embodiments.
Figure 5A:
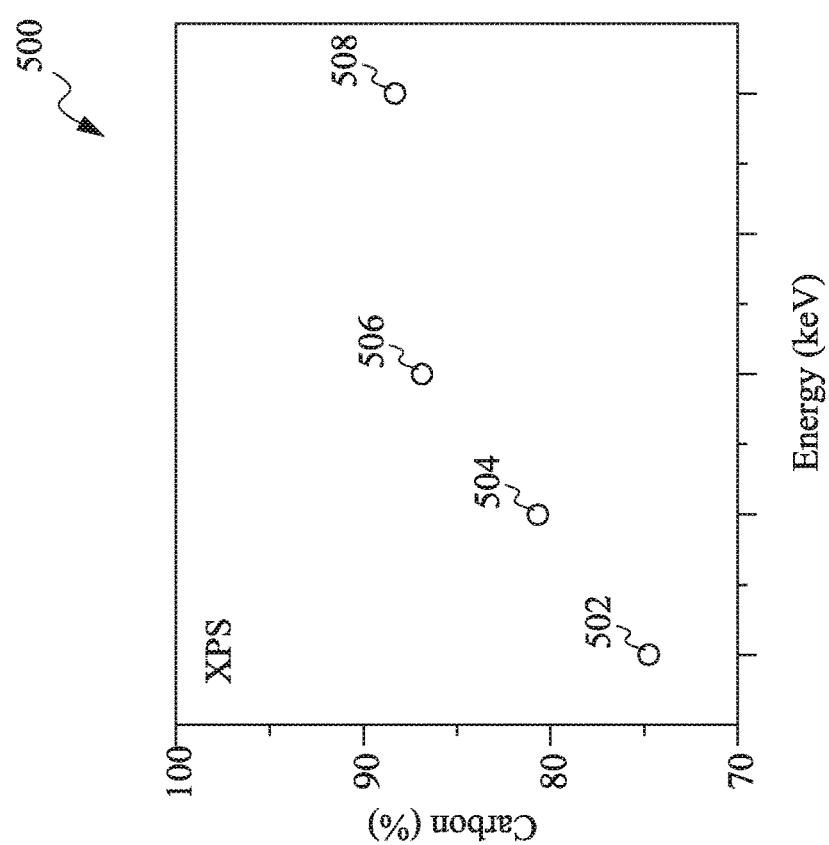
FIG. 5A is a graph illustrating the ratio of carbon in an example crust layer as a function of implant energy level, in accordance with some embodiments.

FIG. 5A is a graph 500 illustrating the ratio of carbon in an example BARC layer as a function of implant energy level. Depicted are four example carbon percentage measurements (502, 504, 506, 508) for a crust layer at different implant energy levels. The example measurements were taken from p-type wafers that were coated with a BARC layer. A crust layer was created on the BARC layers using an implant process at different implant energy levels, and measurements were taken of the crust layers by X-ray Photoelectron Spectroscopy (XPS).

As illustrated in the example graph 500, as the implant energy level increased, the percent carbon in the BARC layer increased. The increased implant energy level allowed for increased scission of C—O a C—H bonds, which leads to an increase in carbon content. It is known that a higher carbon percentage in a BARC layer results in an increased ability of a BARC layer to reduce metal loss in a metal pull back by wet etch process. Thus, by increasing the implant energy level and correspondingly the carbon percentage, the effectiveness of the BARC layer at reducing metal loss increases.

FIG. 5B is a graph 520 illustrating the ratio of oxygen in an example BARC layer as a function of implant energy level. Depicted are four example oxygen percentage measurements (522, 524, 526, 528) for a crust layer at different implant energy levels. The example measurements were taken from p-type wafers that were coated with a BARC layer. A crust layer was created on the BARC layers using an implant process at different implant energy levels, and measurements were taken of the crust layers by X-ray Photoelectron Spectroscopy (XPS).

As illustrated in the example graph 520, as the implant energy level increased, the percent oxygen in the BARC layer decreased. It is known that a lower oxygen percentage in a BARC layer results in an increased ability of a BARC layer to reduce metal loss in a metal pull back by wet etch process. Thus, by increasing the implant energy level and correspondingly decreasing the oxygen percentage, the effectiveness of the BARC layer at reducing metal loss increases.

Figure 6A:
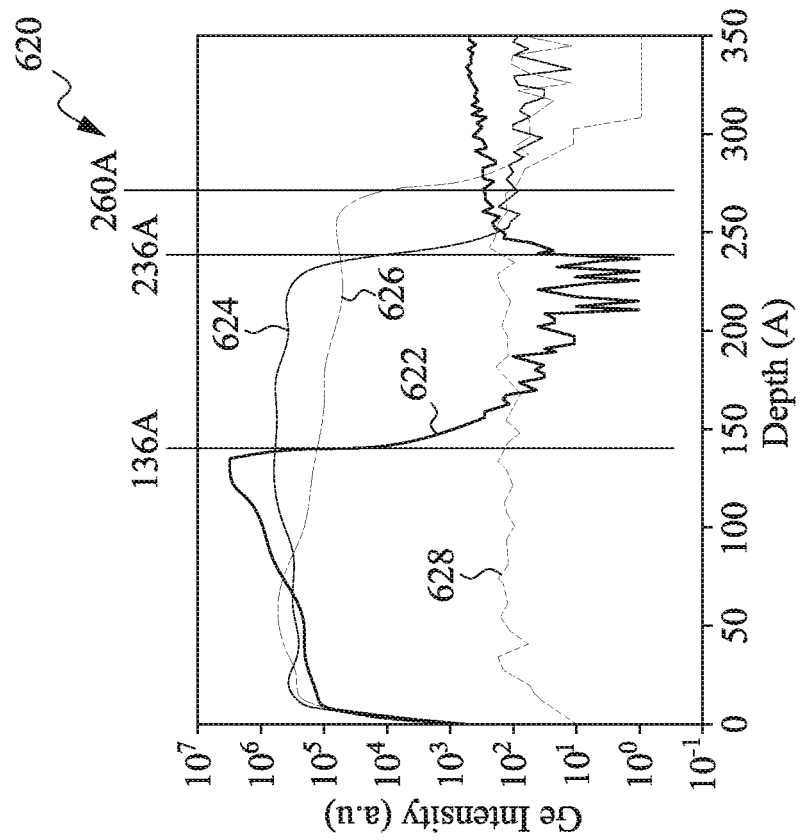
FIG. 6A is a graph illustrating example measurements of carbon concentrations with depth using Secondary Ion Mass Spectrometry (SIMS), in accordance with some embodiments.

FIG. 6A is a graph 600 illustrating example measurements of carbon concentrations with depth using Secondary Ion Mass Spectrometry (SIMS). Depicted are four example carbon intensity plots (602, 604, 606, 608) for a BARC layer at different implant energy levels using germanium (GE) for the implant. The implant energy level for plot 602 was greater than the implant energy level for plot 604, the implant energy level for plot 604 was greater than the implant energy level for plot 606, and the implant energy level for plot 606 was greater than the implant energy level for plot 608. The example measurements were taken from p-type wafers that were coated with a BARC layer. A crust layer was created on the BARC layers using an implant process with GE as the implant at different implant energy levels, and SIMS measurements were taken of the BARC layers.

As illustrated in the example graph 600, as the implant energy level increased, the carbon intensity was more highly concentrated closer to the surface of the BARC layer. The higher carbon intensity closer to the surface of the BARC layer results in an increased ability of a BARC layer to reduce metal loss in a metal pull back by wet etch process. Thus, by increasing the implant energy level and correspondingly increasing the carbon intensity closer to the surface of the BARC layer, the effectiveness of the BARC layer at reducing metal loss increases.

Figure 6B:
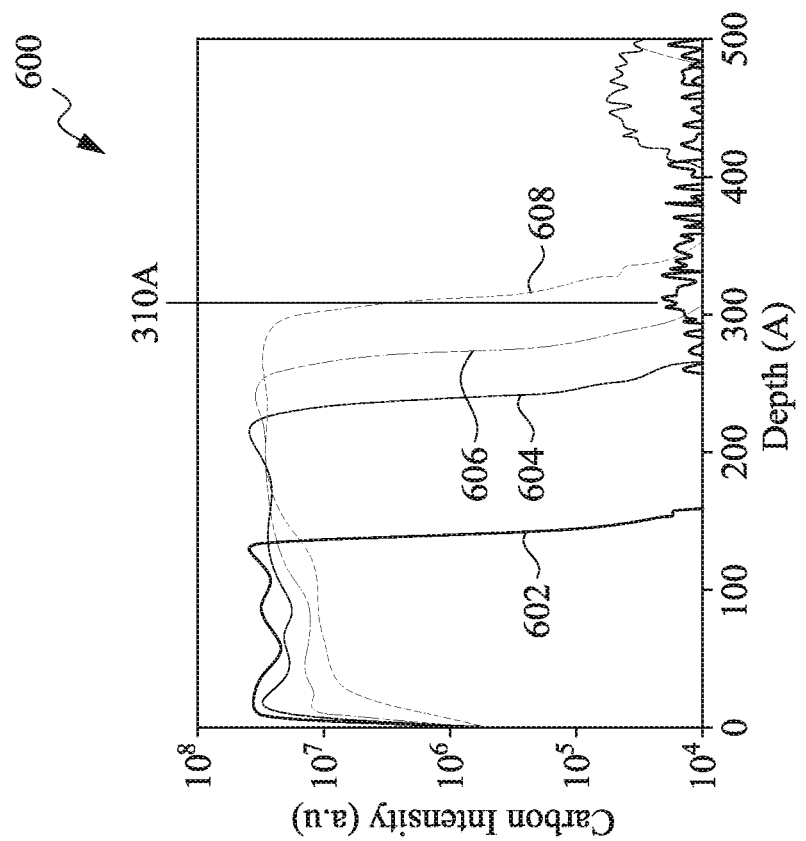
FIG. 6B is a graph illustrating example measurements of germanium concentrations with depth using SIMS, in accordance with some embodiments.

FIG. 6B is a graph 620 illustrating example measurements of GE concentrations with depth using SIMS. Depicted are four example GE intensity plots (622, 624, 626, 628) for a BARC layer at different implant energy levels. The implant energy level for plot 622 was greater than the implant energy level for plot 624, the implant energy level for plot 624 was greater than the implant energy level for plot 626, and the implant energy level for plot 626 was greater than the implant energy level for plot 628. The example measurements were taken from p-type wafers that were coated with a BARC layer. A crust layer was created on the BARC layers using an implant process using GE at different implant energy levels, and SIMS measurements were taken of the BARC layers.

As illustrated in the example graph 620, as the implant energy level increased, the GE intensity was more highly concentrated closer to the surface of the BARC layer. The higher GE intensity closer to the surface of the crust layer illustrates that increasing implant energy level can result in reduced thickness of the BARC layer.

Figure 7B:
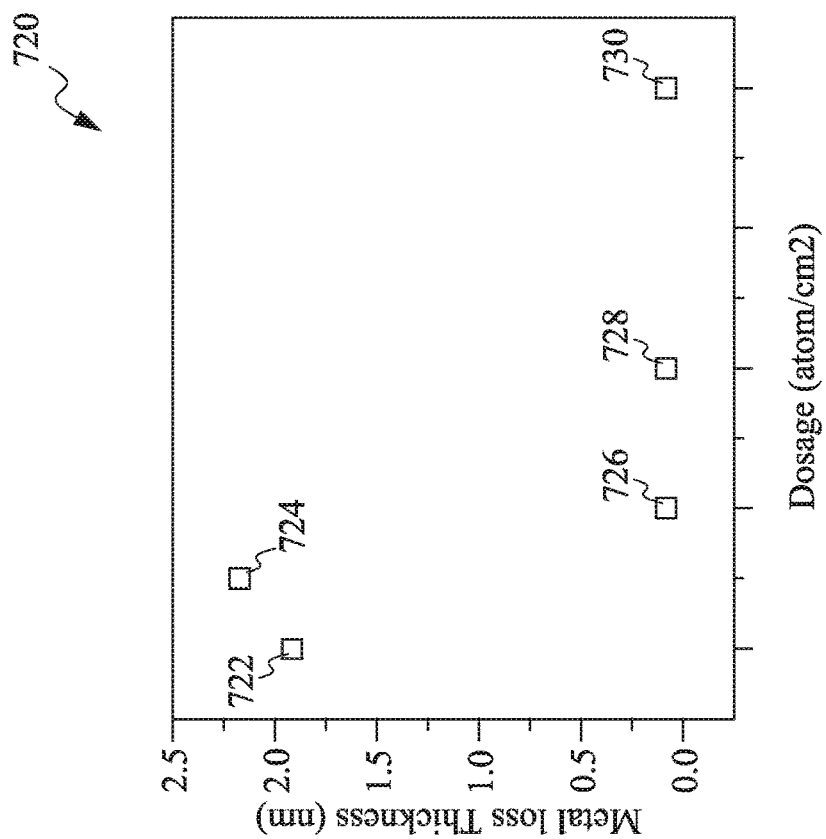
FIG. 7B is a graph illustrating metal loss thickness at different implant dosage levels at a fixed implant energy level, in accordance with some embodiments.
Figure 7A:
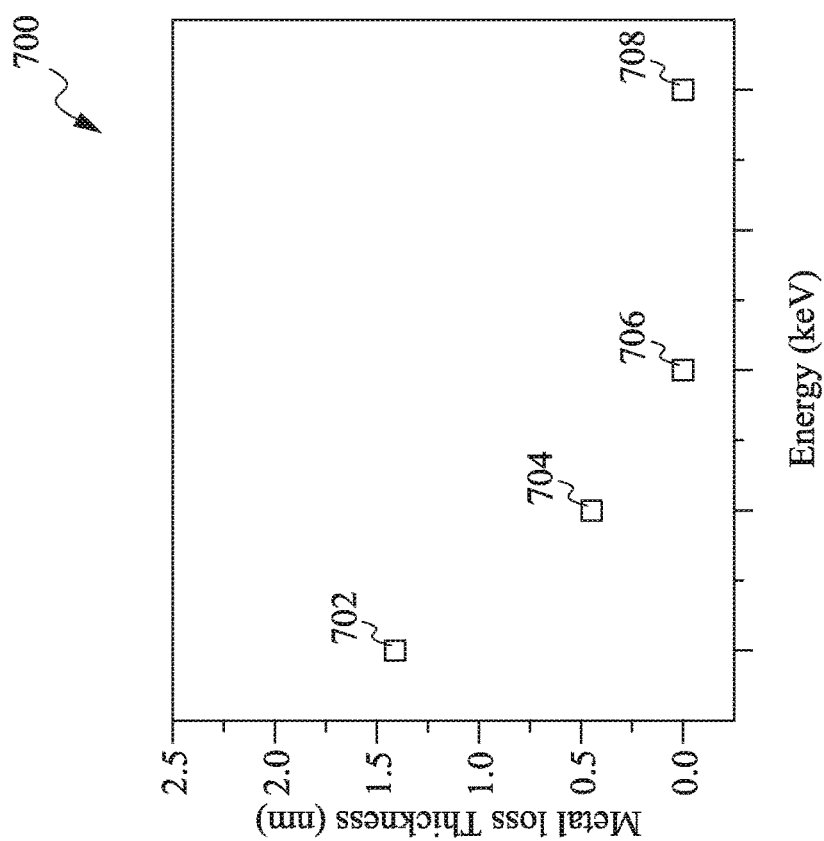
FIG. 7A is a graph illustrating metal loss thickness at different implant energy levels, in accordance with some embodiments.

FIG. 7A is a graph 700 illustrating metal loss thickness at different implant energy levels. Depicted are four example metal loss measurements (702, 704, 706, 708) in a metal pull back by wet etch process with different implant energy levels. As illustrated in the example graph 700, as the implant energy level increased, the amount of metal loss decreased. As the implant energy level increased to a certain level, zero or near zero metal loss could be achieved. This illustrates that implant energy level may be controlled to achieve zero or close to zero metal loss.

FIG. 7B is a graph 720 illustrating metal loss thickness at different implant dosage levels at a fixed implant energy level. Depicted are five example metal loss measurements (722, 724, 726, 728, 730) in a BARC etch back process with different implant dosage levels. As illustrated in the example graph 720, the implant dosage level can be increased to a level where zero or near zero metal loss could be achieved without changing the implant energy level. This illustrates that implant dosage level may be controlled to achieve zero or close to zero metal loss.

Figure 8:
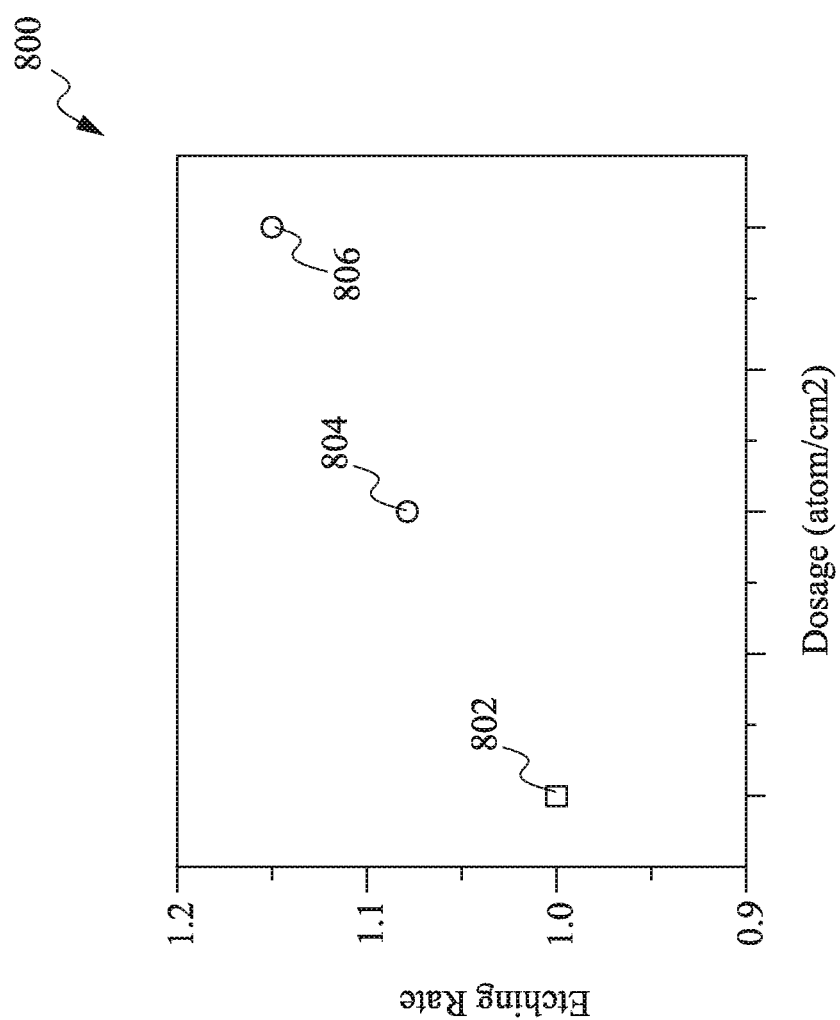
FIG. 8 is a graph illustrating etching rate during metal pull back by wet process operations versus implant dosage at a fixed implant energy level, in accordance with some embodiments.

FIG. 8 is a graph 800 illustrating etching rate during metal pull back by wet process operations versus implant dosage at a fixed implant energy level. Depicted are three example implant dosage measurements (802, 804, 806). The implant layer formed on upper portions of a metal layer results in a higher etching rate during a metal pull back by wet etch process. The graph 800 illustrates that the etching rate increases as the dosage level increases and, consequently, less time is needed during a metal pull back by wet etch process. This is helpful because a longer etching time can result in an increased likelihood of unwanted metal loss during the wet etching operations.

The described systems, methods, techniques, and articles can provide a crust layer on a BARC layer that can protect against unwanted metal loss during metal pull back by wet process operations. The described systems, methods, techniques, and articles can increase the etching rate during metal pull back by wet process operations thereby reducing etching time and reducing the likelihood of unwanted metal loss during the metal pull back by wet process operations. The described systems, methods, techniques, and articles can be applied in many fabrication processes such as S/D contact formation processes, other contact formation processes, FinFET fabrication processes, semiconductor fabrication processes, and others.

A semiconductor fabrication method includes: receiving a structure having a plurality of gate stacks, a source/drain (S/D) region disposed between two of the gate stacks, and a metal layer disposed over the gate stacks and the S/D region; forming a BARC (bottom anti-reflective coating) layer over a portion of the metal layer disposed over the S/D region and between the two gate stacks; forming a crust layer on top of the BARC layer through implanting operations with a dopant; and removing unwanted metal layer sections using wet etching operations, wherein the crust layer and BARC layer protect metal layer sections under the BARC layer from metal loss during the wet etching operations.

In certain embodiments of the semiconductor fabrication method, forming a crust layer includes forming a crust layer with a depth between 1 to about 30 nm.

In certain embodiments of the semiconductor fabrication method, forming a crust layer includes consuming the upper BARC thickness in a range from 1 to about 50 nm during the implanting operations.

In certain embodiments of the semiconductor fabrication method, the method further includes forming an implant profile in an upper metal section disposed over the gate sections during the implanting operations, wherein the implant profile consumes a thickness depth of the upper metal section disposed over the gate sections.

In certain embodiments of the semiconductor fabrication method, the thickness depth of the upper metal section consumed during the implanting operations ranges from 1 to about 15 nm.

In certain embodiments of the semiconductor fabrication method, the BARC layer after crust formation has a carbon ratio that ranges from 80 to about 90%.

In certain embodiments of the semiconductor fabrication method, the BARC layer after crust formation has an oxygen ratio that ranges from 10 to about 25%.

In certain embodiments of the semiconductor fabrication method, the method further includes controlling an implant energy level to achieve a desired carbon ratio in the BARC layer during implanting operations.

In certain embodiments of the semiconductor fabrication method, the method further includes controlling an implant energy level to achieve a desired oxygen ratio in the BARC layer during implanting operations.

In certain embodiments of the semiconductor fabrication method, the method further includes controlling an implant energy level to achieve a desired carbon concentration intensity near the surface of the BARC layer.

In certain embodiments of the semiconductor fabrication method, the method further includes controlling an implant energy level to achieve zero or near zero metal loss during the wet etching operations.

In certain embodiments of the semiconductor fabrication method, the method further includes controlling an implant dosage level to a level to achieve zero or near zero metal loss during the wet etching operations.

In certain embodiments of the semiconductor fabrication method, the method further includes controlling an implant dosage level to achieve a desired etching rate during the wet etching operations.

In certain embodiments of the semiconductor fabrication method, the dopant includes silicon (Si), germanium (Ge), neon (Ne), argon (Ar), xenon (Xe), or radon (Ra).

A method of forming a contact includes: receiving a semiconductor structure having an opening into which the contact is to be formed; forming a metal layer in the opening; forming a bottom anti-reflective coating (BARC) layer in the opening; performing implanting operations with a dopant on the BARC layer and the metal layer, the performing implanting operations including controlling an implant energy level and controlling an implant dosage level to form a crust layer with a desired minimum depth on top of the BARC layer; removing unwanted metal layer sections using wet etching operations, wherein the crust layer and BARC layer protect remaining metal layer sections under the BARC layer from metal loss during the wet etching operations; removing the crust layer and the BARC layer; and forming the contact in the opening over the remaining metal layer sections.

In certain embodiments of the method of forming a contact, performing implanting operations includes controlling the implant energy level and controlling the implant dosage level to form the crust layer with a depth between 1 to about 30 nm.

In certain embodiments of the method of forming a contact, performing implanting operations includes consuming the upper BARC thickness in a range from 1 to about 50 nm during the implanting operations.

In certain embodiments of the method of forming a contact, performing implanting operations includes forming an implant profile in an upper metal section disposed over the gate sections during the implanting operations, wherein the implant profile consumes a thickness depth of the upper metal section disposed over the gate sections.

In certain embodiments of the method of forming a contact, the thickness depth of the upper metal section consumed during the implanting operations ranges from 1 to about 15 nm.

In certain embodiments of the method of forming a contact, the BARC layer after the implanting operations has a carbon ratio that ranges from 80 to about 90%.

In certain embodiments of the method of forming a contact, the BARC layer after the implanting operations has an oxygen ratio that ranges from 10 to about 25%.

In certain embodiments of the method of forming a contact, performing implanting operations includes controlling an implant energy level to achieve zero or near zero metal loss during the wet etching operations.

In certain embodiments of the method of forming a contact, performing implanting operations includes controlling an implant dosage level to a level to achieve zero or near zero metal loss during the wet etching operations.

In certain embodiments of the method of forming a contact, performing implanting operations includes controlling an implant dosage level to achieve a desired etching rate during the wet etching operations.

In certain embodiments of the method of forming a contact, the dopant includes silicon (Si), germanium (Ge), neon (Ne), argon (Ar), xenon (Xe), or radon (Ra).

In certain embodiments of the method of forming a contact, performing implanting operations includes controlling an implant energy level to achieve a desired carbon ratio in the BARC layer during implanting operations.

In certain embodiments of the method of forming a contact, performing implanting operations includes controlling an implant energy level to achieve a desired oxygen ratio in the BARC layer during implanting operations.

In certain embodiments of the method of forming a contact, performing implanting operations includes controlling an implant energy level to achieve a desired carbon concentration intensity near the surface of the BARC layer.

A semiconductor fabrication method includes: receiving a structure having a plurality of gate stacks, a source/drain (S/D) region disposed between two of the gate stacks, a metal layer disposed over the gate stacks and the S/D region, and a BARC (bottom anti-reflective coating) layer disposed over a portion of the metal layer disposed over the S/D region and between the two gate stacks; performing implanting operations with a dopant on the BARC layer and the metal layer, the performing implanting operations including controlling an implant energy level and controlling an implant dosage level to form a crust layer with a desired minimum depth on top of the BARC layer; and removing unwanted metal layer sections using wet etching operations, wherein the crust layer and BARC layer protect metal layer sections under the BARC layer from metal loss during the wet etching operations.

In certain embodiments of the semiconductor fabrication method, performing implanting operations includes controlling the implant energy level and controlling the implant dosage level to form the crust layer with a depth between 1 to about 30 nm.

In certain embodiments of the semiconductor fabrication method, performing implanting operations includes consuming the upper BARC thickness in a range from 1 to about 50 nm during the implanting operations.

In certain embodiments of the semiconductor fabrication method, performing implanting operations includes forming an implant profile in an upper metal section disposed over the gate sections during the implanting operations, wherein the implant profile consumes a thickness depth of the upper metal section disposed over the gate sections.

In certain embodiments of the semiconductor fabrication method, the thickness depth of the upper metal section consumed during the implanting operations ranges from 1 to about 15 nm.

In certain embodiments of the semiconductor fabrication method, the BARC layer after the implanting operations has a carbon ratio that ranges from 80 to about 90%.

In certain embodiments of the semiconductor fabrication method, the BARC layer after the implanting operations has an oxygen ratio that ranges from 10 to about 25%.

In certain embodiments of the semiconductor fabrication method, performing implanting operations includes controlling an implant energy level to achieve zero or near zero metal loss during the wet etching operations.

In certain embodiments of the semiconductor fabrication method, performing implanting operations includes controlling an implant dosage level to a level to achieve zero or near zero metal loss during the wet etching operations.

In certain embodiments of the semiconductor fabrication method, performing implanting operations includes controlling an implant dosage level to achieve a desired etching rate during the wet etching operations.

In certain embodiments of the semiconductor fabrication method, the dopant includes silicon (Si), germanium (Ge), neon (Ne), argon (Ar), xenon (Xe), or radon (Ra).

In certain embodiments of the semiconductor fabrication method, performing implanting operations includes controlling an implant energy level to achieve a desired carbon ratio in the BARC layer during implanting operations.

In certain embodiments of the semiconductor fabrication method, performing implanting operations includes controlling an implant energy level to achieve a desired oxygen ratio in the BARC layer during implanting operations.

In certain embodiments of the semiconductor fabrication method, performing implanting operations includes controlling an implant energy level to achieve a desired carbon concentration intensity near the surface of the BARC layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor fabrication method comprising:
  receiving a structure having a source/drain (S/D) region disposed between two gate stacks, a metal layer disposed over the two gate stacks and the S/D region, and a BARC (bottom anti-reflective coating) layer disposed over a portion of the metal layer disposed over the S/D region and between the two gate stacks;
  forming a crust layer with a desired minimum depth on top of the BARC layer by controlling an implant energy level and an implant dosage level while implanting a dopant in the BARC layer and the metal layer; and
  removing a first section of metal layer using wet etching operations, wherein the crust layer and BARC layer protect a second section of metal layer under the BARC layer from metal loss during the wet etching operations.

2. The method of claim 1, wherein controlling the implant energy level comprises controlling the implant energy level to achieve zero or near zero metal loss of the second section of metal layer during the wet etching operations.

3. The method of claim 1, wherein controlling the implant dosage level comprises controlling the implant dosage level to achieve zero or near zero metal loss of the second section of metal layer during the wet etching operations.

4. The method of claim 1, wherein controlling the implant dosage level comprises controlling the implant dosage level to achieve a desired etching rate during the wet etching operations.

5. The method of claim 1, wherein controlling the implant energy level comprises controlling the implant energy level to achieve a desired carbon ratio in the BARC layer during implanting operations.

6. The method of claim 1, wherein controlling the implant energy level comprises controlling the implant energy level to achieve a desired carbon concentration intensity near a top surface of the BARC layer.

7. A semiconductor fabrication method comprising:
  receiving a structure having a source/drain (S/D) region disposed between two gate stacks, a metal layer disposed over the two gate stacks and the S/D region, and a BARC (bottom anti-reflective coating) layer disposed over a portion of the metal layer disposed over the S/D region and between the two gate stacks;
  forming a crust layer with a desired minimum depth on top of the BARC layer while implanting a dopant in the BARC layer and the metal layer; and
  removing a first section of metal layer using wet etching operations, wherein the crust layer and BARC layer protect a second section of metal layer under the BARC layer from metal loss during the wet etching operations.

8. The method of claim 7, wherein the desired minimum depth is between 1 nanometer to about 30 nanometers.

9. The method of claim 7, wherein forming the crust layer comprises consuming an upper BARC thickness in a range from 1 to about 50 nanometers while implanting the dopant.

10. The method of claim 7, further comprising forming an implant profile in an upper metal section disposed over the gate sections while implanting the dopant, wherein the implant profile consumes a thickness depth of the upper metal section disposed over the gate sections.

11. The method of claim 10, wherein the thickness depth of the upper metal section consumed while implanting the dopant ranges from 1 to about 15 nanometers.

12. The method of claim 7, wherein the BARC layer after crust formation has a carbon ratio that ranges from 80 to about 90 percent.

13. The method of claim 7, wherein the BARC layer after crust formation has an oxygen ratio that ranges from 10 to about 25 percent.

14. A semiconductor fabrication method comprising:
  receiving a structure having a source/drain (S/D) region disposed between two gate stacks, a metal layer disposed over the two gate stacks and the S/D region, and a BARC (bottom anti-reflective coating) layer disposed over a portion of the metal layer disposed over the S/D region and between the two gate stacks;

forming a crust layer on top of the BARC layer by controlling an implant energy level and an implant dosage level while implanting a dopant in the BARC layer and the metal layer; and removing a first section of metal layer using wet etching operations, wherein the crust layer and BARC layer protect a second section of metal layer under the BARC layer from metal loss during the wet etching operations.

15. The method of claim 14, wherein controlling the implant energy level comprises controlling the implant energy level to achieve a desired carbon ratio in the BARC layer during implanting operations.

16. The method of claim 15, wherein controlling the implant energy level comprises controlling the implant energy level to achieve a desired oxygen ratio in the BARC layer during implanting operations.

17. The method of claim 14, wherein controlling the implant energy level comprises controlling the implant energy level to achieve a desired carbon concentration intensity near the surface of the BARC layer.

18. The method of claim 14, wherein controlling the implant energy level comprises controlling the implant energy level to achieve zero or near zero metal loss of the second section of metal layer during the wet etching operations.

19. The method of claim 14, wherein controlling the implant dosage level comprises controlling the implant dosage level to achieve zero or near zero metal loss of the second section of metal layer during the wet etching operations.

20. The method of claim 14, wherein controlling the implant dosage level comprises controlling the implant dosage level to achieve a desired etching rate during the wet etching operations.

* * * * *